United States Patent [19] [11] Patent Number: 4,900,952
Hosotani et al. [45] Date of Patent: Feb. 13, 1990

[54] VOLTAGE COMPARISON APPARATUS

[75] Inventors: Shiro Hosotani; Takahiro Miki; Toshio Kumamoto, all of Itami, Japan

[73] Assignee: Mitsubishi Denki Kabushiki Kaisha, Japan

[21] Appl. No.: 303,778

[22] Filed: Jan. 27, 1989

[30] Foreign Application Priority Data

Oct. 7, 1988 [JP] Japan .................. 63-254132

[51] Int. Cl.⁴ .............................................. H03K 5/24
[52] U.S. Cl. ................... 307/355; 307/356; 307/362
[58] Field of Search ........... 307/355, 362, 356, 357; 328/146, 147, 149

[56] References Cited

U.S. PATENT DOCUMENTS 4,028,558  6/1977  Heller et al. ................... 307/355
4,523,107  6/1985  Peterson ......................... 307/362
4,547,683  10/1985 Bingham ........................ 307/355
4,748,418  5/1988  Kerth ............................. 307/362

FOREIGN PATENT DOCUMENTS 61-33011  2/1986  Japan .

Primary Examiner—John Zazworsky
Attorney, Agent, or Firm—Townsend & Townsend

[57] ABSTRACT

The voltage comparison apparatus of the invention features a timing control of clocks by which individual switches are ON/OFF controlled so that before a preceding amplifier circuit goes into comparison mode from auto zero mode, a successive amplifier circuit may go into auto zero mode from comparison mode, or before the preceding amplifier circuit goes into auto zero mode from comparison mode, the successive amplifier circuit may go into comparison mode from auto zero mode, whereby before the preceding amplifier circuit undergoes transition from the auto zero mode to the comparison mode, the successive amplifier circuit goes into the auto zero mode from the comparison mode, or before the preceding amplifier circuit undergoes transition from the comparison mode to the auto zero mode, the successive amplifier circuit goes into the comparison mode from the auto zero mode, and even when considerable variation occurs in input voltage difference during each clock cycle or clock time lags occurs, stable operation can be assured.

2 Claims, 8 Drawing Sheets

VOLTAGE COMPARISON APPARATUS

BACKGROUND OF THE INVENTION

1. Field of the Invention

This invention relates to a chopper-type voltage comparison apparatus.

2. Description of the Prior Art

FIG. 1 is a circuit diagram showing, by way of example, the arrangement of a conventional chopper-type voltage comparison apparatus as disclosed in Japanese Patent Application Laid-Open No. 61-33011(1986).

The voltage comparison apparatus consists essentially of an input unit 1 and an amplifier unit 100 having two stages of amplifier circuits 2 and 3.

The input unit 1 comprises a first switch S1 connected at one end to a first input terminal 4 and at the other end to an output terminal 6 and adapted to be ON/OFF controlled by a clock $\phi_1$, and a second switch S2 connected at one end to a second input terminal 5 and at the other end to aforesaid output terminal 6 and adapted to be ON/OFF controlled by a clock $\phi_2$ which acts in complementary relation with the clock $\phi_1$.

A first voltage $V_1$ to be compared is applied to the first input terminal 4, and a second voltage $V_2$ to be compared is applied to the second input terminal 5.

The amplifier circuit 2, for which the output terminal 6 of the input unit 1 serves as an input terminal, includes a coupling capacitor $C_1$ connected at one end to the input terminal, an inverting amplifier 11 having its input connected through a node 7 to the other end of the capacitor $C_1$ and having its output connected to an output terminal 8, and a feedback route switch S3 connected at one end to the node 7 and at the other end to the output terminal 8 and adapted to be ON/OFF controlled by the clock $\phi_1$.

The amplifier circuit 3, for which the output terminal 8 of the amplifier circuit 2 serves as an input terminal, includes a coupling capacitor $C_2$ connected at one end to the input terminal, an inverting amplifier 12 having its input connected through a node 9 to the other end of the coupling capacitor $C_2$ and having its output connected to an output terminal 10, and a feedback route switch S4 connected at one end to the node 9 and at the other end to the output terminal 10 and adapted to be ON/OFF controlled by the clock $\phi_2$.

Operation of such conventional voltage comparison apparatus will be explained with reference to a timing chart shown in FIG. 2.

In FIG. 2, characters (a), (b), (c), (d), (e), (f) and (g) designates, respectively, clock $\phi_1$; clock $\phi_2$; potential $V_6$ at output terminal 6 of the input unit 1; potential $V_7$ at node 7 of the amplifier circuit 2; potential $V_8$ at output terminal 8 of the amplifier circuit 2; potential $V_9$ at node 9 of the amplifier circuit 3; and potential $V_{10}$ at output terminal 10 of the amplifier circuit 3.

As FIG. 2 (a) shows, when clock $\phi_1$ is at "1" (at high level), the first switch S1 and feedback route switch S3 turn on and the second switch S2 turns off. Thus, the node 7 of the amplifier circuit 2 and the output terminal 8 are short-circuited relative to each other. Such operating condition of the amplifier circuit is hereinafter referred to as "auto zero mode".

In the condition of auto zero mode, there is potential equality between the node 7 and the output terminal 8 in the amplifier circuit 2. Therefore, the potential between the node 7 and the output terminal 8 in the amplifier circuit 2 in such case is equal to a potential Vbal determined by an intersecting point M in a transfer characteristic curve m of the inverting amplifier 11 (12) relative to a straight line 1 satisfying the relation "output voltage"="input voltage" as shown in FIG. 3 (the potential Vbal is hereinafter referred to as balance potential). Accordingly, in a period of this mode, the coupling capacitor $C_1$ is charged by input voltage $V_1$ applied through the first switch S1 and also by balance voltage Vbal 1 of the inverting amplifier 11.

While clock $\phi_1$ is at "0" (at low level), the first switch S1 and the feedback route switch S3 turn off and, on the other hand, the second switch S2 turns on. Such condition of operation of the amplifier circuit is hereinafter referred to as "comparison mode".

In the condition of comparison mode, by turning off of the feedback route switch S3, the input side impedance of the inverting amplifier 11 becomes infinite. Accordingly, any voltage variation "$V_2-V_1$" (hereinafter referred to as input differential voltage) occurring at the input side of the coupling capacitor $C_1$ is transmitted to the output-side node 7 of the coupling capacitor $C_1$, and is inversely amplified at the inverting amplifier 11. As FIG. 2 (e) shows, a final voltage at the output terminal 8 in a period of comparison mode operation is $V_8$, the voltage variation at the output terminal 8 is expressed as "$V_8-$Vbal 1".

Operation of the amplifier circuit 3 is performed as follows.

When clock $\phi_1$ is at "0", or clock $\phi_2$ in FIG. 2 (b) is at "1", the feedback route switch S4 turns on and the amplifier circuit 3 goes into auto zero mode. In this case, the amplifier circuit 2 becomes in comparison mode; therefore, in a period of such operation mode, the coupling capacitor $C_2$ is charged by output voltage $V_8$ of the amplifier circuit 2 in comparison mode and also by balance voltage Vbal 2 of the inverting amplifier 12.

As clock $\phi_1$ again goes into "1", that is, clock $\phi_2$ goes into "0", the feedback route switch S4 turns off and the amplifier circuit 3 goes into comparison mode. In this case, the amplifier circuit 2 takes auto zero mode, and accordingly the potential of the output terminal 8 changes from $V_8$ to balance voltage Vbal 1.

Meanwhile, the amplifier circuit 3 which is then in comparison mode detects a voltage variation "$\Delta V_8=$Vbal $1-V_8$" occurring at its input terminal 9 and same is inversely amplified. If a final voltage at the output terminal 10 in the period is $V_{10}$ as FIG. 2 (g) shows, the output voltage variation at the output terminal 10 is "$V_{10}-$Vbal 2".

With such conventional voltage comparison apparatus in which the amplifier circuit is of the two stage arrangement, it is very unlikely to obtain sufficient voltage gains. In practice, therefore, a further amplifier circuit or inverting amplifier is connected to the apparatus in order to provide desired voltage gains. In the conventional voltage comparison apparatus of such arrangement, voltages $V_1$ and $V_2$ applied respectively on the first input terminal 4 and the second input terminal 5 are compared to determine their difference in potential and finally digital signal "1" (high level) or "0" (low level) are issued.

Now, such conventional voltage comparison apparatus of the chopper type as above described, in which the amplifier circuits 2 and 3 are operated by complementary clocks, has only a small margin of operational flexibility relative to the effect of input voltage difference variable clock by clock and/or relative to delicate time lags between clocks, which may lead to malfunctions or may involve the possibility of no sufficient voltage gain being obtained. This point will be discussed in detail below.

First, possible malfunctions or drop in voltage gains due to input voltage variations will be explained.

FIG. 4 is a timing chart showing conditions of operation of the conventional chopper type voltage comparison apparatus in the case where rising duration of clock and falling duration of clock are taken into consideration. There are shown voltage variations occurring especially when the amplifier circuit 2 changes from auto zero mode to comparison mode and when the amplifier circuit 3 changes from comparison mode to auto zero mode.

In FIG. 4, (a) and (b) show clock timing patterns for clock $\phi_1$ and clock $\phi_2$ respectively; and (e), (f), (g) show voltage wave forms at output terminal 8, node 9, and output terminal 10 respectively. Feedback route switches S3 and S4 are both comprised of transmission gates; and Va1, Vb1 represent voltage wave forms applied to N channel type MOS transistor gates, and Va2, Vb2 represent voltage wave forms applied to P channel type MOS transistor gates.

Therefore, Va1 and Vb2 correspond to clock $\phi_1$ and Va2 and Vb1 correspond to clock $\phi_2$.

It is noted that in FIG. 4, Vdd and Vss represent a high voltage source and a low voltage source respectively.

As earlier stated, the amplifier circuit 2 goes in auto zero mode when clock $\phi_1$ is "1", and it goes in comparison mode when clock $\phi_1$ is "0". Both input voltage and output voltage of the inverting amplifier 11 in auto zero mode are a balance voltage Vbal 1 (usually set at a medium value between Vdd and Vss), therefore a transition point between the two modes is a potential at which voltage between gate and source is smaller than a threshold limit voltage, namely, $(Va1 - Vbal1) = Vtn1$ or a potential at which the following relation is satisfied;

$(Vbal1 - Va2) = |Vtp1|$.

In the above relations, Vtn1 and |Vtp1| represent threshold limit voltages for N channel type MOS transistor and P channel type MOS transistor respectively. Therefore, assuming that the both are equal in value, the transition point between the two modes is at the time when t=t1 as shown in FIG. 4.

In the amplifier circuit 3, mode becomes comparison mode when clock $\phi_1$ is "1" (high level), or in other words, when clock $\phi_2$ is "0" (low level), and again mode becomes comparison mode when clock $\phi_1$ is "0", or in other words when clock $\phi_2$ is "1". Therefore, the output amplitude of the amplifier circuit 3 in comparison mode is comparatively small. Thus, assuming that the voltage level of the circuit is generally equal to balance voltage Vbal 2 (for example, if input voltage difference is 1 mV, and voltage gain per stage of amplifier circuit is 10, the output amplitude of the amplifier circuit 3 is 0.1 V), the point of transition from comparison mode to auto zero mode in the amplifier circuit 3, as is the case with the amplifier circuit 2, is at the time when t=t2 as FIG. 4 shows.

Therefore, in such case, the amplifier circuit 2 and the amplifier circuit 3 are not in fully complementary relation to each other in operation, there being periods in which both circuits are in comparison mode, that is, periods which meet the relation t1≦t≦t2. This may be a cause of malfunction.

It is believed that such malfunction can occur, for example, when there is a minor input voltage difference during a preceding clock cycle and when there is a large input voltage difference during a next following clock cycle. Such situation is illustrated in cases (e), (f) and (g) of FIG. 4.

When a large input voltage difference is applied, as FIG. 4 (e) shows, the output voltage of the amplifier circuit 2 abruptly fluctuates at a wide amplitude in a region of t≧t1. On the other hand, the input of the amplifier circuit 3, when t≦t1, is stable at a certain voltage with a minor amplitude under the influence of total input, and when t1≦t≦t2, as FIG. 4 (f) shows, a voltage variation at the output terminal 8 of the amplifier circuit 2 is transmitted to the amplifier circuit 3 because comparison mode is present, and as a result there arises a voltage variation in the amplifier 3.

If such voltage variation is of same polarity as a voltage variation occurred previously to the period of t=t1, there is no particular problem, but if the change is different in polarity, there arises a problem. That is, when the variation in voltage is different in polarity, the amplitude of the voltage relative to balance voltage Vbal 2 of the amplifier circuit 3 is small. In other words, available voltage gain is small, or there is a possibility of malfunction.

The foregoing description relates to the case where a large input voltage difference occurs after one clock cycle in which a minor input voltage difference is present; but even in the case where only a small input voltage difference is involved, there is a possibility of malfunction or voltage gain drop.

When there is a somewhat large input voltage difference the amplitude of outputs at the output terminal 10 of the amplifier circuit 3 is comparatively large. In such a case, therefore, voltage between gate and source of either the N channel type MOS transistor or the P channel type MOS transistor is large, and accordingly the timing for turn on of the transmission gate is quickened and time lag between t1 and t2 is reduced. The magnitude of the possibility of malfunction and possible drops in voltage gain depend on the degree of variation in input voltage difference which may vary clock after clock. Malfunctions and voltage gain drops will occur under composite infuence of those factors.

In the above described instance, it is assumed that the feedback route switches S3, S4 are comprised of transmission gates. In the case where the switches are comprised of N-channel type or P-channel type transistors, it is likely that, depending upon the polarity of output amplitude, there will be greater time lag between t1 and t2, and accordingly there may be a more serious problem.

The above described problem concerns the case where emphasis is put on input voltage difference and rising duration and falling duration. But in the case where there is a time lag between clock $\phi_1$ and clock $\phi_2$, a similar problem will occur. This point will be explained with reference to FIGS. 5 and 6.

FIG. 5 is a timing chart illustrating the case where there is a time lag of td between the timing for transition of clock $\phi_1$ from "1" to "0" and the timing for transition of clock $\phi_2$ from "0" to "1".

In FIG. 5, (a) and (b) show clock timings for clock $\phi_1$ and clock $\phi_2$ respectively, and (e), (f) and (g) show voltage wave forms at the output terminal 8, the node 9, and the output terminal 10 respectively.

The amplifier circuit 2 goes into comparison mode when $t \leq t1$, and into auto zero mode when $t \geq t1$. The amplifier circuit 3 goes into auto zero mode when $t \leq t2$, and into comparison mode when $t \geq t2$. Accordingly, there are periods in which the two amplifier circuits 2 and 3 are simultaneously in auto zero mode, that is, $t1 \leq t \leq t2$, which is a cause of voltage gain drop. This point is specifically explained below.

In FIG. 2, the output of the amplifier circuit 2, that is, voltage variation $\Delta V8$ at the output terminal 8 in the course of transition from comparison mode to auto zero mode is transmitted to the input side node 9 of the amplifier circuit 3, and the same is further amplified by the inverting amplifier 12, which is as already mentioned. If there is a period in which both the amplifier circuits 2 and 3 simultaneously become auto zero mode, the amplitude of voltage variation at the output terminal 8 of the amplifier circuit 2 is considerably lowered when it is transferred to the later stage.

As FIG. 6 shows, the voltage at the output terminal 8 when $t = t1$ is V8, and the voltage when $t = t2$ is V8'. In this case, since the amplifier circuit 3 is in auto zero mode, voltage variations "V8−V8'" during the period of "$t = t1 - t2$" are not transmitted to the amplifier circuit 3; accordingly, voltage variations actually detected are those which have occurred after $t = t2$, that is "V8'−Vbal 2". If the voltage variation is taken as $\Delta V8'$, then the amplitude of outputs of the amplifier circuit 3 corresponds to a value obtained by multiplying the voltage variation amplification factor, and if the amplification factor is same, the resulting amplitude is considerably smaller than the case where value $\Delta V8$ is applied. By this reason, there will be a voltage gain drop due to the time lag between clock $\phi_1$ and clock $\phi_2$.

SUMMARY OF THE INVENTION

This invention is directed to overcome these problems, and accordingly it is a primary object of the invention to provide a voltage comparison apparatus which can eliminate possible malfunctions and/or possible voltage gain drops due to large input voltage difference and/or clock time lags.

The voltage comparison apparatus of the invention features a timing control of clocks by which individual switches are ON/OFF controlled so that before a preceding amplifier circuit goes into comparison mode from auto zero mode, a next amplifier circuit may go into auto zero mode from comparison mode, or before the preceding amplifier circuit goes into auto zero mode from comparison mode, the next amplifier circuit may go into comparison mode from auto zero mode, whereby before the preceding amplifier circuit undergoes transition from the auto zero mode to the comparison mode, the next amplifier circuit goes into the auto zero mode from the comparison mode, and when the preceding circuit undergoes transition from the comparison mode to the auto zero mode and when there occurs considerable variation in input voltage difference during each clock cycle or there occur clock time lags, stable operation can be assured.

The above and further objects and features of the invention will more fully be apparent from the following detailed description with accompanying drawings.

DESCRIPTION OF THE PREFERRED EMBODIMENTS

An embodiment of the invention will now be described in detail with reference to the accompanying drawings showing the embodiment.

Figure 1:
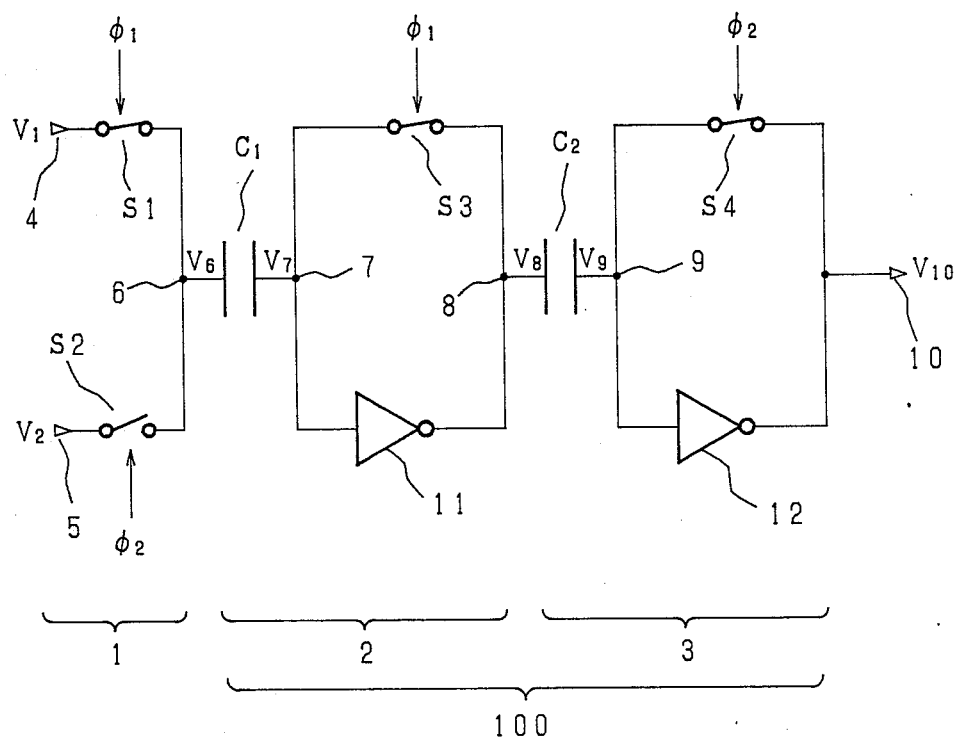
FIG. 1 is a circuit diagram showing the arrangement of a conventional chopper-type voltage comparison apparatus.
Figure 2:
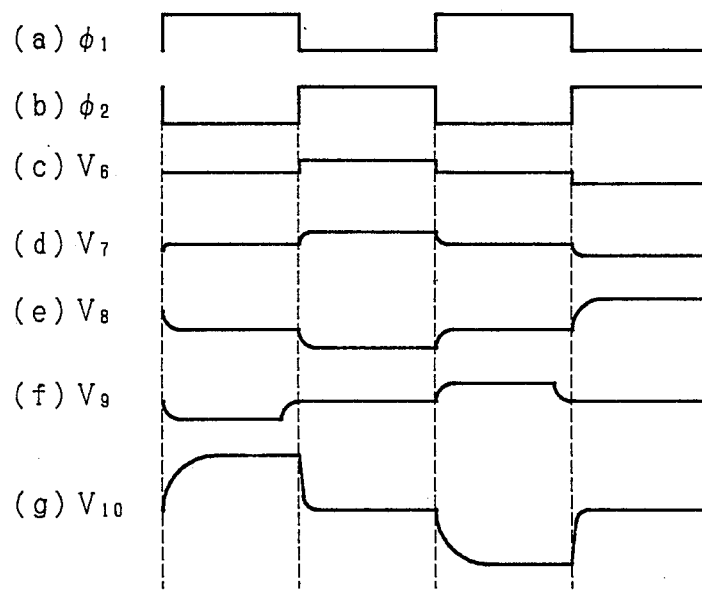
FIG. 2 is a timing chart illustrating operation thereof.
Figure 7:
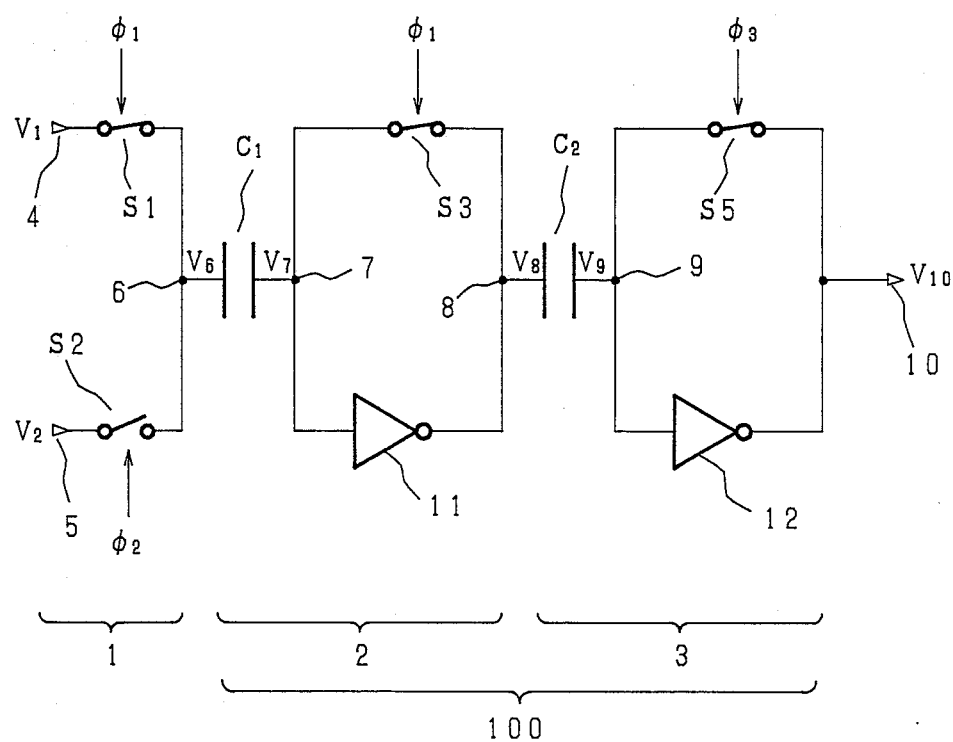
FIG. 7 is a circuit diagram showing the arrangement of a chopper-type voltage comparison apparatus embodying the invention.

FIG. 7 is a circuit diagram showing the arrangement of the voltage comparison apparatus according to the invention. In addition, parts identical with those in FIG. 1 showing the arrangement of the conventional voltage comparison apparatus, or corresponding parts are designated by the same reference numerals or characters.

The voltage comparison apparatus of the invention consists essentially of an input unit 1 and an amplifier unit 100 having two stages of amplifier circuits 2 and 3.

The input unit 1 comprises a first switch S1 connected at one end to a first input terminal 4 and at the other end to an output terminal 6 and adapted to be ON/OFF controlled by a clock $\phi_1$, and a second switch S2 connected at one end to a second input terminal 5 and at the other end to aforesaid output terminal 6 and adapted to be ON/OFF controlled by a clock $\phi_2$ which acts in complementary relation with the clock $\phi_1$.

A first voltage $V_1$ to be compared is applied to the first input terminal 4, and a second voltage $V_2$ to be compared is applied to the second input terminal 5.

The amplifier circuit 2, for which the output terminal 6 of the input unit 1 serves as an input terminal, includes a coupling capacitor $C_1$ connected at one end to the input terminal, an inverting amplifier 11 having its input connected through a node 7 to the other end of the capacitor $C_1$ and having its output connected to an output terminal 8, and a feedback route switch S3 connected at one end to the node 7 and at the other end to the output terminal 8 and adapted to be ON/OFF controlled by the clock $\phi_1$.

The amplifier circuit 3, for which the output terminal 8 of the amplifier circuit 2 serves as an input terminal, includes a coupling capacitor $C_2$ connected at one end to the input terminal, an inverting amplifier 12 having its input connected through a node 9 to the other end of the coupling capacitor $C_2$ and having its output connected to an output terminal 10, and a feedback route switch S5 connected at one end to the node 9 and at the other end to the output terminal 10 and adapted to be ON/OFF controlled by a clock $\phi_3$.

Figure 8:
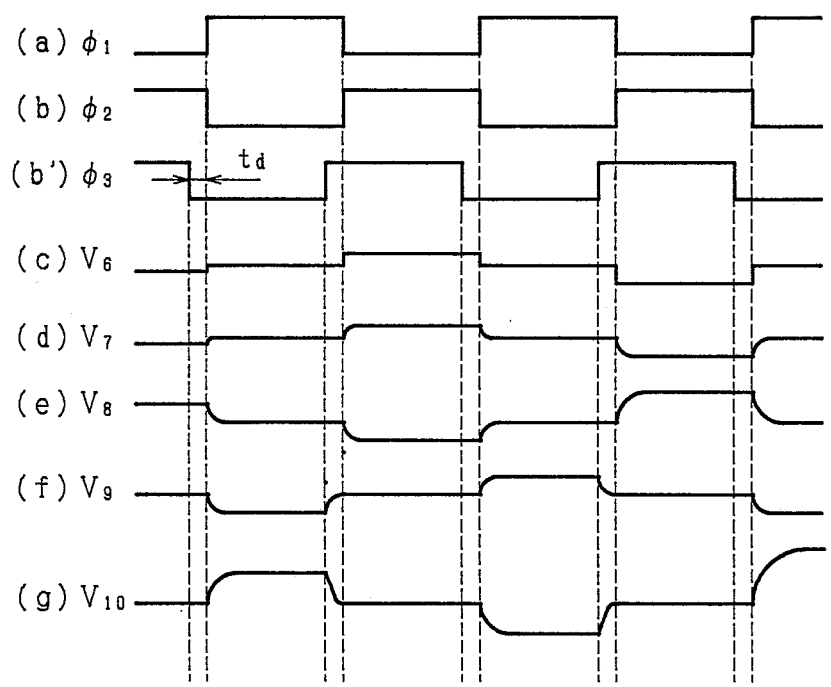
FIG. 8 is a timing chart illustrating the operation thereof.

The clock $\phi_3$ which ON/OFF controls the feedback route switch S5, as FIG. 8 (b') shows, is slightly advanced by time td in both rising duration and falling duration as compared with the clock $\phi_2$.

Next, operation of the voltage comparison apparatus of the invention will be explained with reference to the timing chart in FIG. 8.

In FIG. 8, (a) represents clock $\phi_1$; (b) represents clock $\phi_2$; (b') represents clock $\phi_3$; (c) represents potential $V_6$ at the output terminal 6 of the input unit 1; (d) represents potential $V_7$ at the node 7 of the amplifier circuit 2; (e) represents potential $V_8$ at the output terminal 8 of the amplifier circuit 2; (f) represents potential $V_9$ at the node 9 of the amplifier circuit 3; and (g) represents potential $V_{10}$ at the output terminal 10 of the amplifier circuit 3.

As FIG. 8 (a) shows, when clock $\phi_1$ is at "1" (at high level), the first switch S1 and feedback route switch S3 turn on and the second switch S2 turns off. Thus, the node 7 of the amplifier circuit 2 and the output terminal 8 are short-circuited relative to each other. Such operating condition of the amplifier circuit is hereinafter referred to as "auto zero mode".

Figure 3:
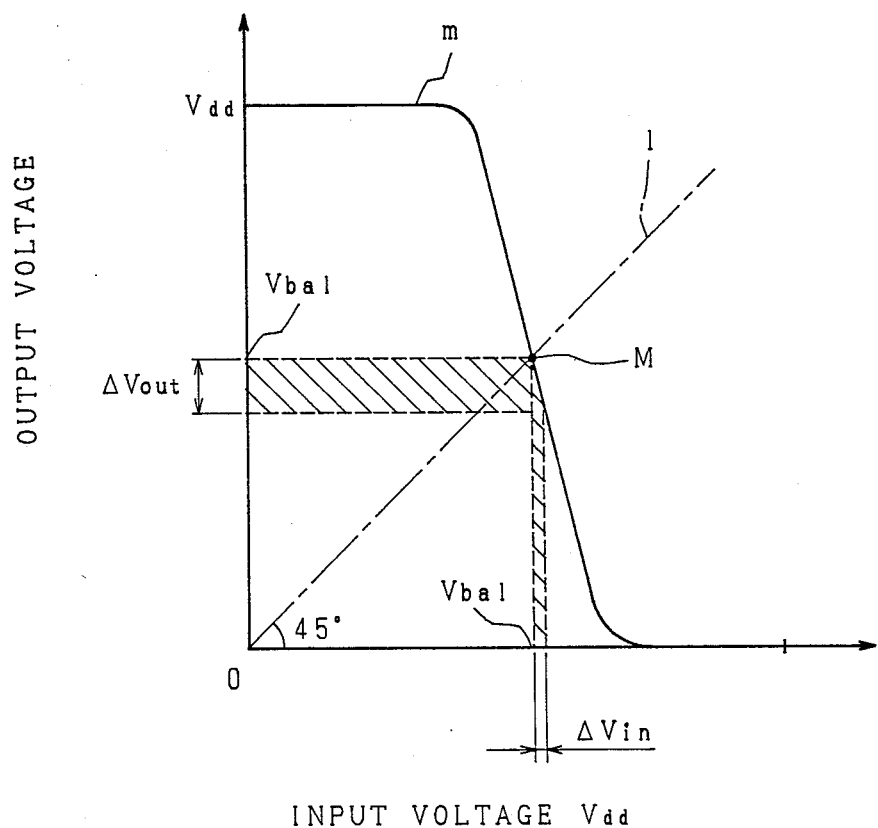
FIG. 3 is a graph showing balance voltages of an inverting amplifier.
Figure 4:
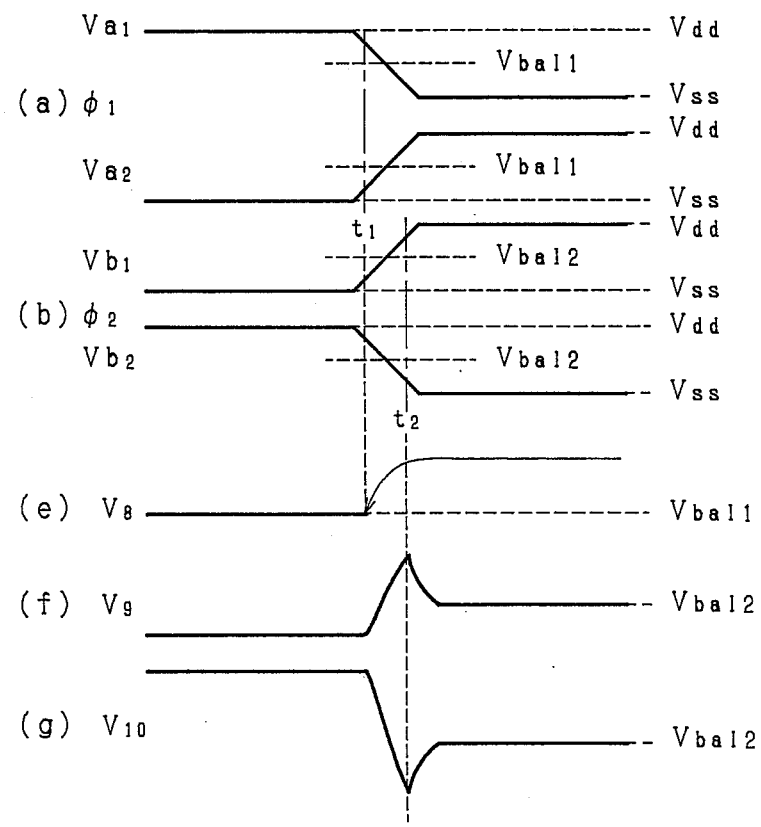
FIG. 4 is a timing chart illustrating operation of the conventional voltage comparison apparatus in the case where rising duration and falling duration conditions are taken into consideration.
Figure 5:
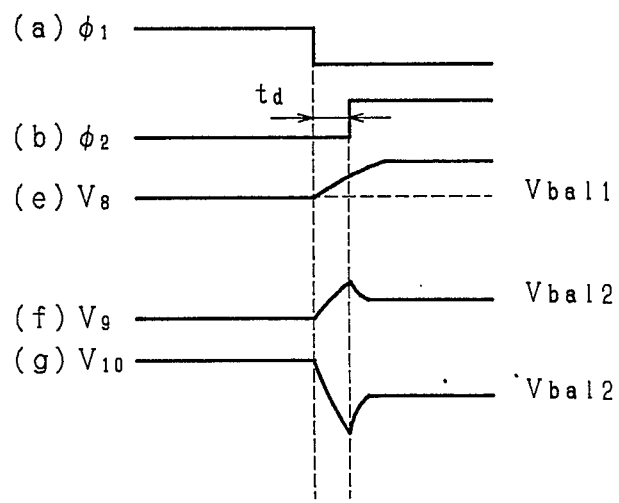
FIGS. 5 and 6 are timing charts illustrating operation of the conventional voltage comparison apparatus in the case where there are clock time lags.
Figure 6:
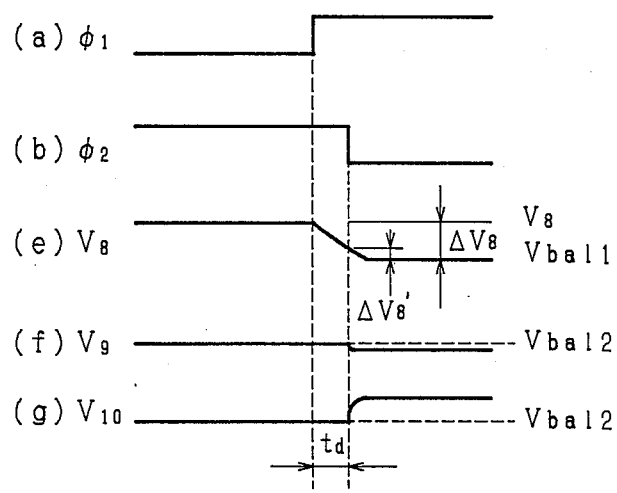

In the condition of auto zero mode, there is potential equality between the node 7 and the output terminal 8 in the amplifier circuit 2. Therefore, the potential between the node 7 and the output terminal 8 in the amplifier circuit 2 in such case is equal to a potential Vbal determined by an intersecting point M in a transfer characteristic curve m of the inverting amplifier 11 (12) relative to a straight line 1 satisfying the relation "output voltage"="input voltage" as shown in FIG. 3 (the potential Vbal is hereinafter referred to as balance potential). Accordingly, in a period of this mode, the coupling capacitor $C_1$ is charged by input voltage $V_1$ applied through the first switch S1 and also by balance voltage Vbal 1 of the inverting amplifier 11.

While clock $\phi_1$ is at "0" (at low level), the first switch S1 and the feedback route switch S3 turn off and, on the other hand, the second switch S2 turns on. Such condition of operation of the amplifier circuit is hereinafter referred to as "comparison mode".

In the condition of comparison mode, by turning off of the feedback route switch S3, the input side impedance of the inverting amplifier 11 becomes infinite. Accordingly, any voltage variation "$V_2-V_1$" (hereinafter referred to as input differential voltage) occurring at the input side of the coupling capacitor $C_1$ is transmitted to the output-side node 7 of the coupling capacitor $C_1$, and is inversely amplified at the inverting amplifier 11. As FIG. 8 (e) shows, a final voltage at the output terminal 8 in a period of comparison mode operation is $V_8$, the voltage variation at the output terminal 8 is expressed as "$V_8-$Vbal 1".

Next, operation of the amplifier circuit 3 will be explained.

In the case where clock $\phi_3$ is "1", the feedback route switch S5 turns on and the amplifier circuit 3 goes into auto zero mode. In this case, the amplifier circuit 2 is in comparison mode, the coupling capacitor $C_1$ is charged by output voltage $V_8$ of the amplifier circuit 2 in comparison mode and also by balance voltage Vb1 2 of the inverting amplifier 12.

As clock $\phi_3$ goes into "0", the feedback route switch S5 turns off and the amplifier circuit 3 goes into comparison mode. In this case, the amplifier circuit 2 takes auto zero mode, and therefore the potential of the output terminal 8 varied from $V_8$ to balance voltage Vbal 1.

Meanwhile, the amplifier circuit 3 which is then in comparison mode detects a voltage variation "$\Delta V_8=$Vbal 1$-V_8$" occurring at its input terminal 9 and the same is inversely amplified. If a final voltage at the output terminal 10 in the period is $V_{10}$ as FIG. 8 (g) shows, the output voltage variation at the output terminal 10 is "$V_{10}-$Vbal 2".

Now, clock $\phi_3$ is advanced by td in phase in relation to clock $\phi_2$, therefore, before the amplifier circuit 2 undergoes transition from auto zero mode to comparison mode, the amplifier circuit 3 undergoes transition from comparison mode to auto zero mode; similarly, before the amplifier circuit 2 goes from comparison mode to auto zero mode, the amplifier circuit 3 goes from auto zero mode to comparison mode. Accordingly, if td is greater than aforesaid rising duration and falling duration, there is no possibility of malfunction due to rising duration and falling duration of clock $\phi_2$ as has been the case with conventional voltage comparison apparatus. Even if td is smaller than the rising duration and falling duration, the possibility of malfunction and voltage gain drop can be reduced as compared with the case with the conventional arrangement. This is also true in the case of there being any time lag between clock $\phi_2$ and clock $\phi_3$. There is no possibility of malfunction or voltage gain drop if the time lag is smaller than td.

With the conventional arrangement, in which two stages of amplifier circuits are provided, it is very difficult to obtain sufficient voltage gain. In practice, therefore, additional amplifier circuits or inverting amplifiers are connected to the apparatus in order to obtain the required voltage gain. In such conventional voltage comparison apparatus, voltages $V_1$ and $V_2$ applied to the first input terminal 4 and the second input terminal 5 are compared as to which voltage is higher or lower, and finally digital signals of "1" (high level) or "0" (low level) are issued.

As above described, according to the present invention, pulse timing of clocks for ON/OFF control of the switches are controlled so that before a preceding amplifier circuit goes from auto zero mode to comparison mode, a next amplifier circuit goes into auto zero mode from comparison mode, and before the preceding amplifier goes from comparison mode to auto zero mode, the next amplifier circuit goes into comparison mode from auto zero mode. Therefore, even if there is any substantial variation in input voltage difference during each clock cycle or clock time lags occurs, stable operation stability can be assured without malfunction, and high voltage gains can be obtained.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A voltage comparison apparatus comprising:
    an input unit which has first and second switch means being complementarily ON/OFF controlled, whose one ends are connected together with each other, and whose other ends are supplied with a first voltage and a second voltage to be compared respectively, and
    an amplifier unit having a plurality of amplifier circuits each of whose input terminal is each one end of a coupling capacitor and each of whose other end is connected to each one end of parallel circuits of an inverting amplifier and a feed back route switch means, and each of whose output terminal is each other end of said parallel circuits, in which an input terminal of the first amplifier circuit of said plurality of amplifier circuits is connected to said one end of said input unit, each input terminal of the other amplifier circuits is connected in cascade to output terminals of the amplifier circuits which are located more adjacent said input unit, and the feedback route switch means of at least one of the amplifier circuits is adapted to be ON/OFF controlled in complementary relation to the feedback route switch means of the other amplifier circuits, whereby the feedback route switch means of said at least one amplifier circuit is so controlled that the timing for said switch means is turned on (or off) in advance of the timing of turning off (or on) of the feedback route switch means of the amplifier circuit located more adjacent said input unit.

2. The voltage comparison apparatus as set forth in claim 1, wherein said feedback route switch means are transmission gates.

* * * * *